(12) United States Patent
Huang

(10) Patent No.: US 6,765,799 B1
(45) Date of Patent: Jul. 20, 2004

(54) HEAT DISSIPATING FINS INTERLOCKING MECHANISM

(76) Inventor: Jin-Zong Huang, P.O. Box No. 6-57, Chung Ho, Taipei 235 (TW)

( * ) Notice: Subject to any disclaimer, the term of this patent is extended or adjusted under 35 U.S.C. 154(b) by 0 days.

(21) Appl. No.: 10/393,251

(22) Filed: Mar. 21, 2003

(51) Int. Cl.[7] .............................................. H05K 7/20
(52) U.S. Cl. ....................... 361/709; 361/703; 361/704; 361/710; 165/80.3; 165/185; 174/16.3; 257/722
(58) Field of Search ............................... 361/704, 709, 361/710; 257/706, 722; 174/16.3; 165/80.3, 185

(56) References Cited

U.S. PATENT DOCUMENTS

| | | | | |
|---|---|---|---|---|
| 5,038,858 A | * | 8/1991 | Jordan et al. ................ | 165/185 |
| 6,104,609 A | * | 8/2000 | Chen ............................. | 361/695 |
| 6,176,304 B1 | * | 1/2001 | Lee .............................. | 165/185 |
| 6,336,498 B1 | * | 1/2002 | Wei ............................ | 165/80.3 |
| 6,340,056 B1 | * | 1/2002 | Huang et al. ................ | 165/185 |
| 6,449,160 B1 | * | 9/2002 | Tsai ............................. | 361/709 |
| 6,474,407 B1 | * | 11/2002 | Chang et al. ............... | 165/80.3 |
| 6,607,028 B1 | * | 8/2003 | Wang et al. ................ | 165/185 |

\* cited by examiner

*Primary Examiner*—Boris Chérvinsky
(74) *Attorney, Agent, or Firm*—Troxell Law Office PLLC

(57) ABSTRACT

The present invention of a heat dissipating fin pieces interlocking mechanism includes a plurality of aluminum or copper fin pieces wherein the lower center protruding section is bent and folded into a base plate. Also located on center portion fin pieces is a plurality of venting openings; the center portion fin pieces extend on upper and lower ends into a plurality of locking elements where each is fitted with one or two claws. The claws are connected to the center portion fin piece by a perforated protruding section while the closer edge of the protruding section grows into a neck. The neck turns into a folding part with narrowed end. When a multitude of fin pieces are assembled, the narrowed end of folding part from the back fin piece penetrates through the corresponding perforations of the front fin piece locking elements then fold back flat into a secure interlocking position.

5 Claims, 6 Drawing Sheets

HEAT DISSIPATING FINS INTERLOCKING MECHANISM

BACKGROUND OF THE INVENTION

1) Field of the Invention

The invention relates to an improvement to a heal dissipating fin interlocking mechanism, specifically a plurality of aluminum or steel fins, wherein the upper and lower corners of each fin plate are formed into locking elements. It is the characteristic of this invention that the connecting mechanism is easy to assemble and relatively economical to manufacture.

2) Description of the Prior Art

The central processing unit (CPU) in a computer system generates enormous heat during its operation. The quality of its heat dissipating device affects the computers life expectancy and performances.

The conventional heat dissipating device comprising a metal (usually aluminum) heat dissipating section, wherein on the top thereof are many indentations and cylindrical body of radial fin pieces. The fins enable the metal cylindrical shape to gain a better count of heat dissipating surface areas. Nevertheless, the number of fins on the cylinders is limited by technical difficulties in the cutting, trimming and/or extrusion processes, it therefore limits the heat dissipating surface area and its effectiveness.

A second conventional heat dissipating device was thus invented; it provides mainly a copper frame housing, wherein a large number of continuous narrow, channel-shape fin pieces with bent top and bottom ends are welded to the copper frame housing to form a large number cooling fins installation thereby enabling a large total heat dissipating surfaces area. But in this way the bending processing of thin copper fin pieces and extensive welding procedures are still difficult and expensive. The heavier weight and higher cost of copper (versus aluminum) are the other reasons that this is not an ideal method. Said conventional device is shown in FIG. 5, where a number of copper fin pieces (30), in tall and narrow channel shape, are bent into three sections: a center fin (31), top (32) and bottom (33) fins. Top and bottom fins (32, 33) are folded back parallel to the center fin (31) direction at either ends into an extension plate (34). An outside end of extension plate (34) is again bent orthogonally into a clip piece (35). A perforation (36) on the center fin (31) is made on each of the corresponding positions of the clip pieces (35). When fin pieces (30) are aligned in a close stack formation each clip piece (35) protrudes into the corresponding perforation (36) of the adjacent center fin (31), the protrusion clip piece (35) will then fold into a locking position while the whole stack of fins constitutes a heat dissipating device. As illustrated in FIGS. 5 and 6, the top and bottom fins (32, 33) of adjacent fin pieces are not connected by any means, and are vulnerable to shear forces exerted from sideways. Unless the connections by locking positions are aligned with perfect precision, a slight sideway force may cause the clip pieces (35) to detach or becoming loose. The lack of a secured connection is a major deficiency of the invention. Also, the delicate alignment between the perforations (36) and the clip pieces (35) are both difficult to process and to assemble resulted in a second deficiency of the conventional invention.

SUMMARY OF THE INVENTION

The present invention is thus aimed to provide an improvement interlocking mechanism for the fin pieces type heat dissipating device that is both economical to manufacture and simple to assemble. It is mainly to assemble a plurality of aluminum or copper fin pieces, tall and narrow channel shape from the side view, the four corners of the fin piece are all formed into identical locking elements. When the fins are aligned in the same orientation, one hooked up to another at the locking elements. It is not only easy to assemble in large numbers; the locking elements are also to be processed by the economical sheet metal stamping and pressing methods. Due to the dense stacking of fin pieces, it is extremely effective as a heat dissipating device. Said invention is to be implemented as follow: To assemble a plurality of aluminum or copper fins in the same orientation, the fins are all bent at the lower center protrusions and formed into venting openings at several locations on the main center section. The four corners of the fin piece are formed into projecting locking elements, the element are provided with one or two "claw" at the end. The claws can fit into the corresponding perforation on the projecting locking elements; the bent segment of the claws can be bent flat once it passes through the perforation on the adjacent fin piece locking element, therefore forming a simple and secure connection. This connection can easily be repeated for each of the corners on the fin piece in easy maneuverings to produce a sizable assembly that has much better shear-force resistance capacity.

DETAILED DESCRIPTION OF THE PREFERRED EMBODIMENT

Figure 1:
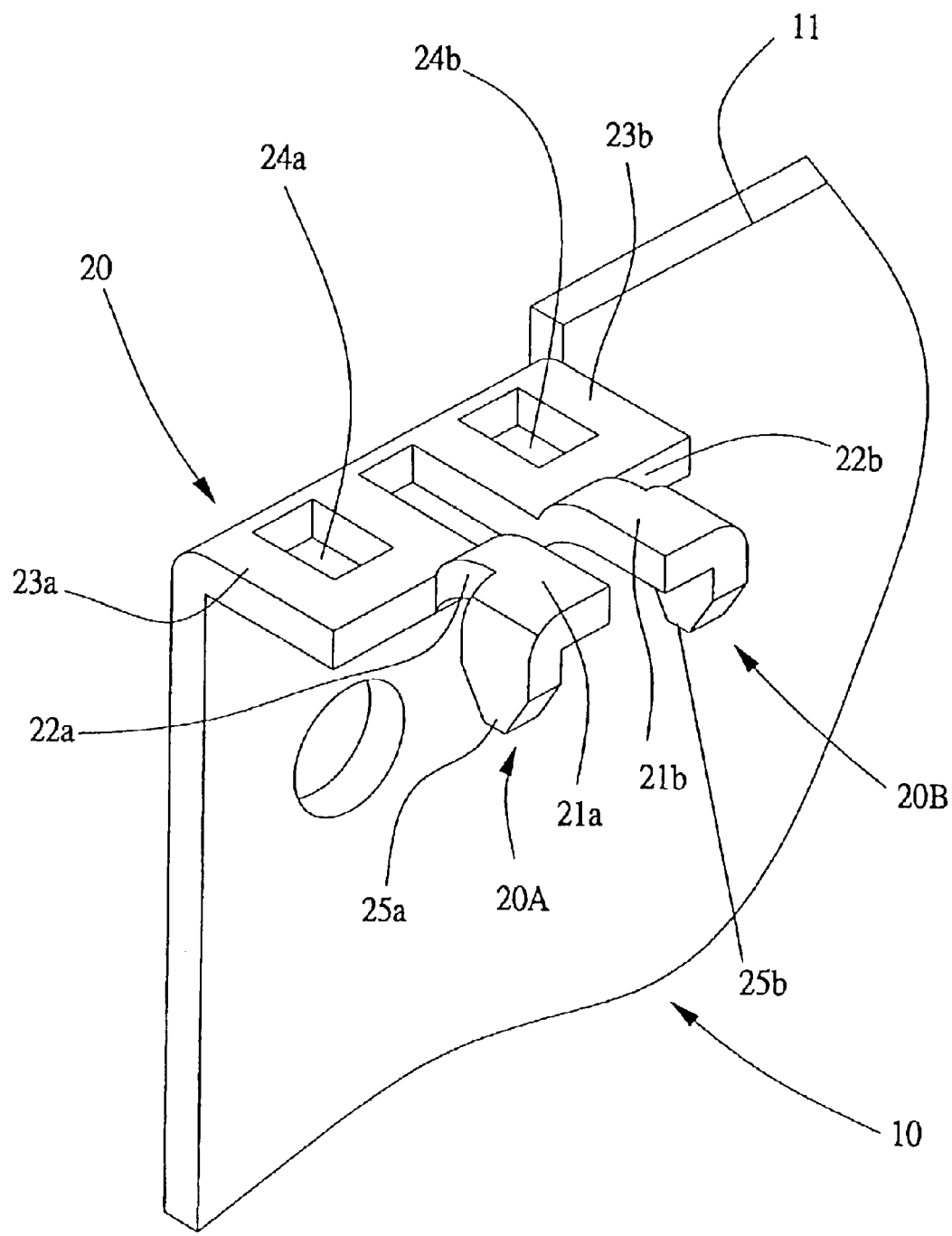
FIG. 1 is a partial enlarged view of the projecting locking element of a typical fin piece corner with two extending claws, of a preferred embodiment according to the present invention.
Figure 2:
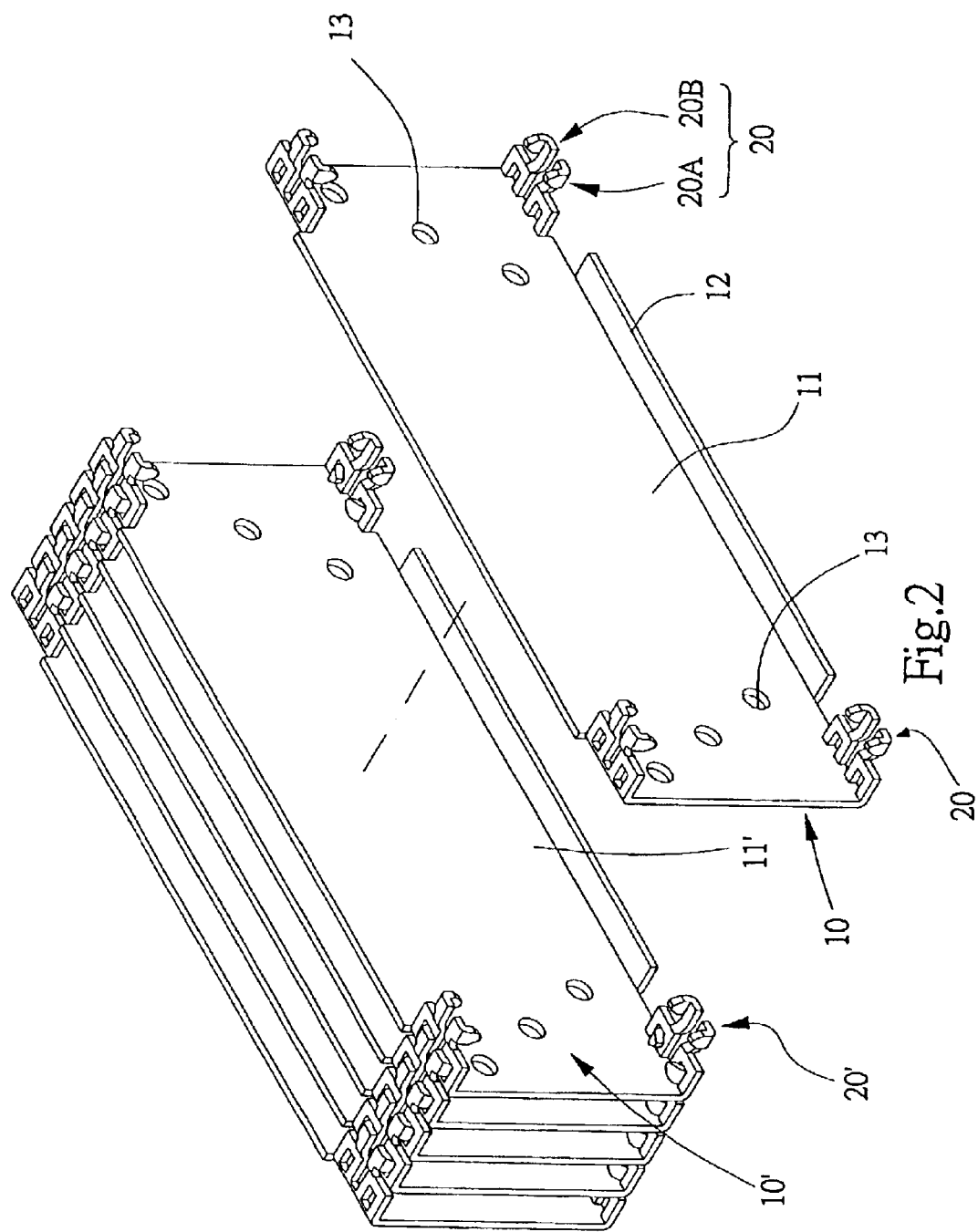
FIG. 2 is an exploded view of an assembly of the fin pieces cooling device according to the present invention.

To enable a further understanding of the said objectives and the technological methods of the invention herein, the brief description of the drawings below is followed by the detailed description of the preferred embodiments:

Referring to FIGS. 1 and 2, the present invention comprises mainly of a plurality of aluminum (or steel) fin pieces (10) wherein each fin piece (10) has an erected center portion fin piece (11) which protrudes toward lower center section and is folded thereof and bent into a base plate (12). The base plate (12) serves as a heat dissipating surface through contact with the CPU (Central processing unit). The fin pieces are provided with several venting openings (13) at the center to facilitate heat dissipation. Four corners of the fin piece are extended into folded locking elements (20) each having fitted with one or two "claw" (20A, 20B) for hooking up with adjacent locking element. FIG. 1 illustrates that the two claws (20A and 20B) in parallel constitute a locking element (20) where each claw (20A or 20B) relates to the center portion fin piece (11) through a protruding section (23a and 23b) wherein each protruding section is provided with a corresponding locking perforations (24a and 24b). The inside edges of the protruding sections (23a and 23b) grow into a pair of necks (22a and 22b) while the other end thereof grows into a stretch of folding parts (21a and 21b), bent at 90 degrees. The tips of the folding parts (21a or 21b) turn into narrowed ends (25a and 25b) for easy hooking up.

Figure 3:
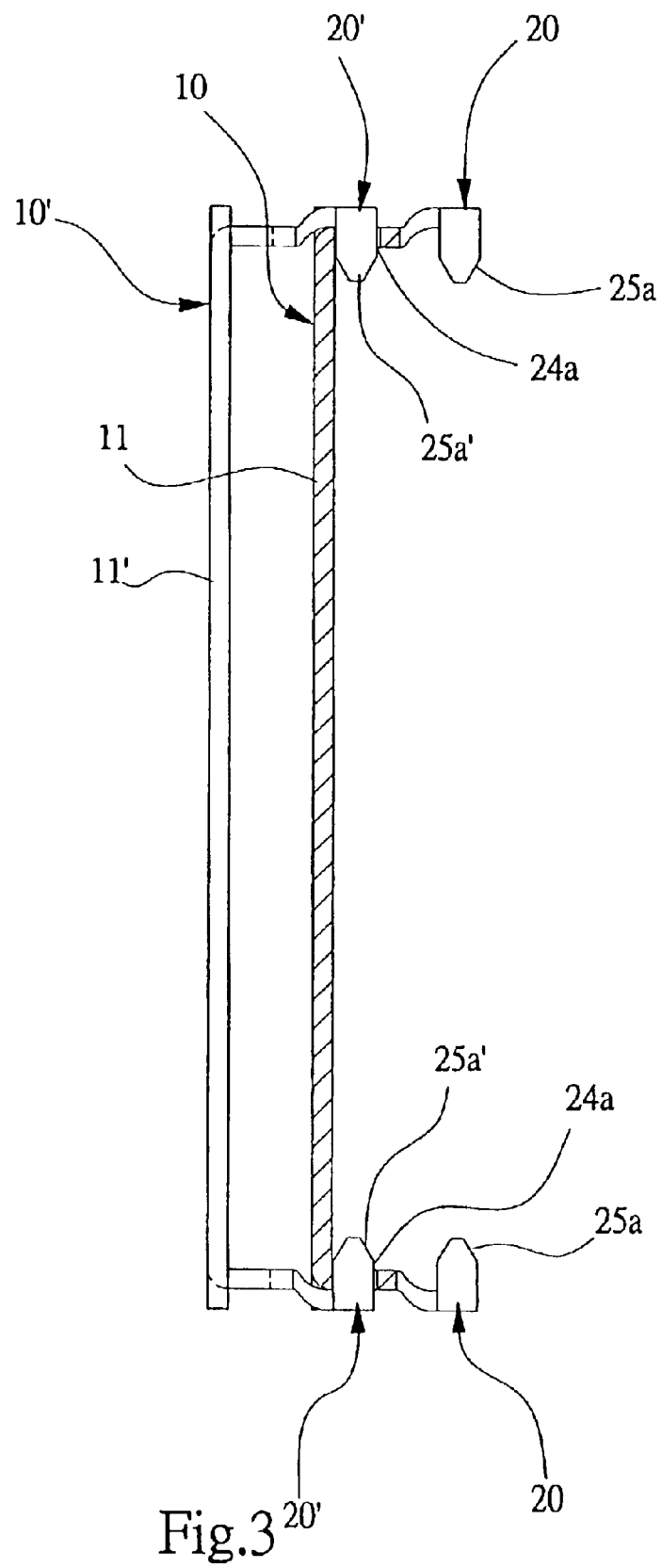
FIG. 3 is a cross-sectional view of a typical metal fin piece according to the present invention.
Figure 4:
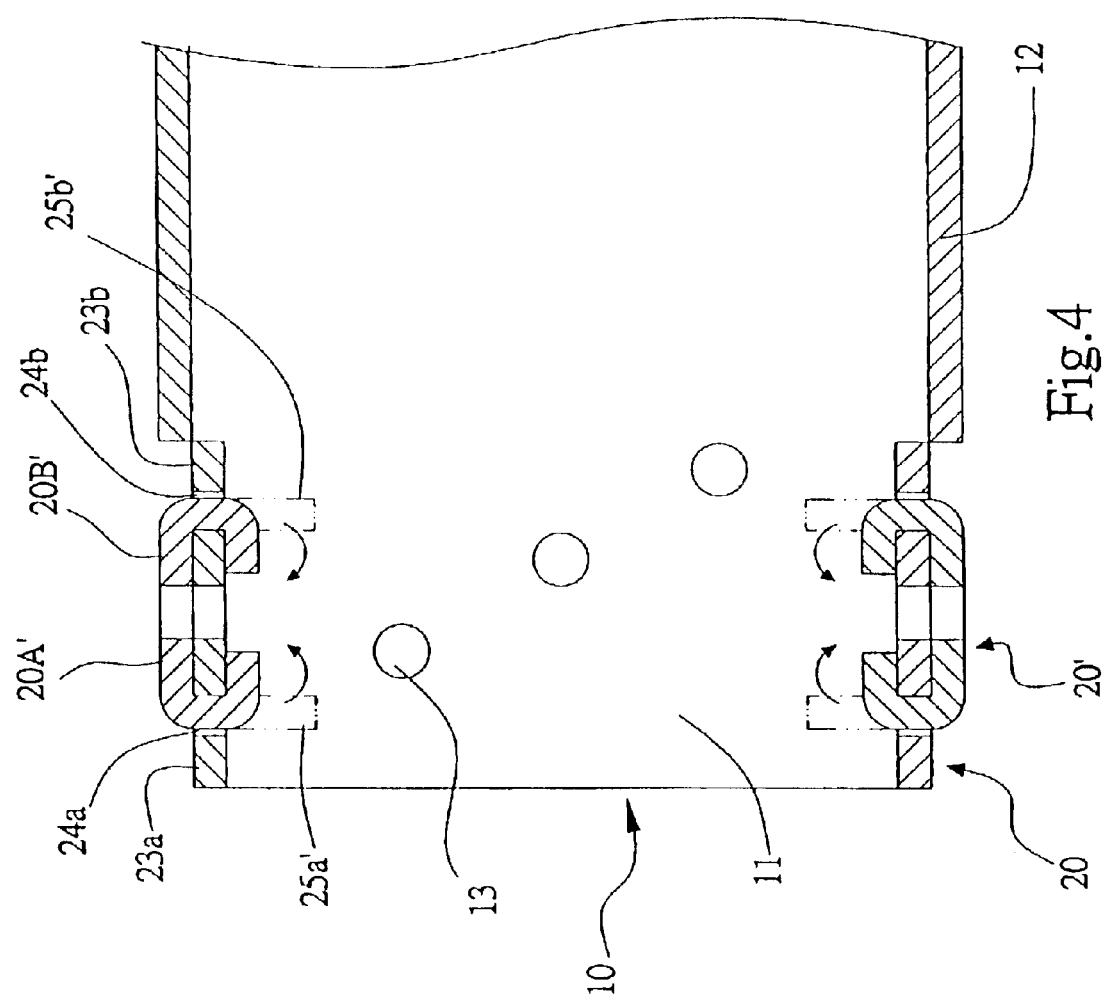
FIG. 4 is a front sectional view drawing of a typical metal fin piece according to the present invention.
Figure 5:
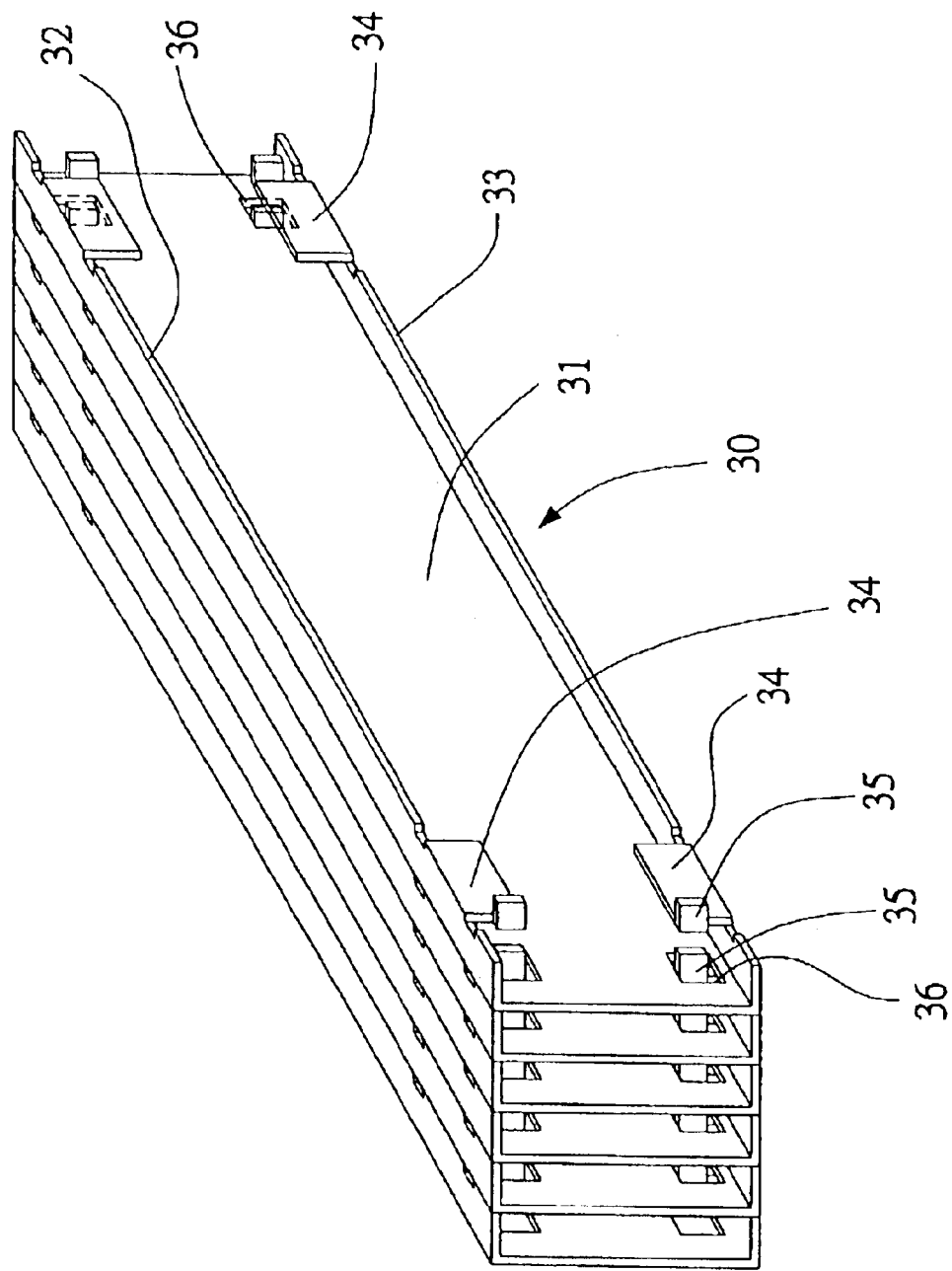
FIG. 5 is a three dimensional view of an assembly of conventional fin pieces heat dissipating device.
Figure 6:
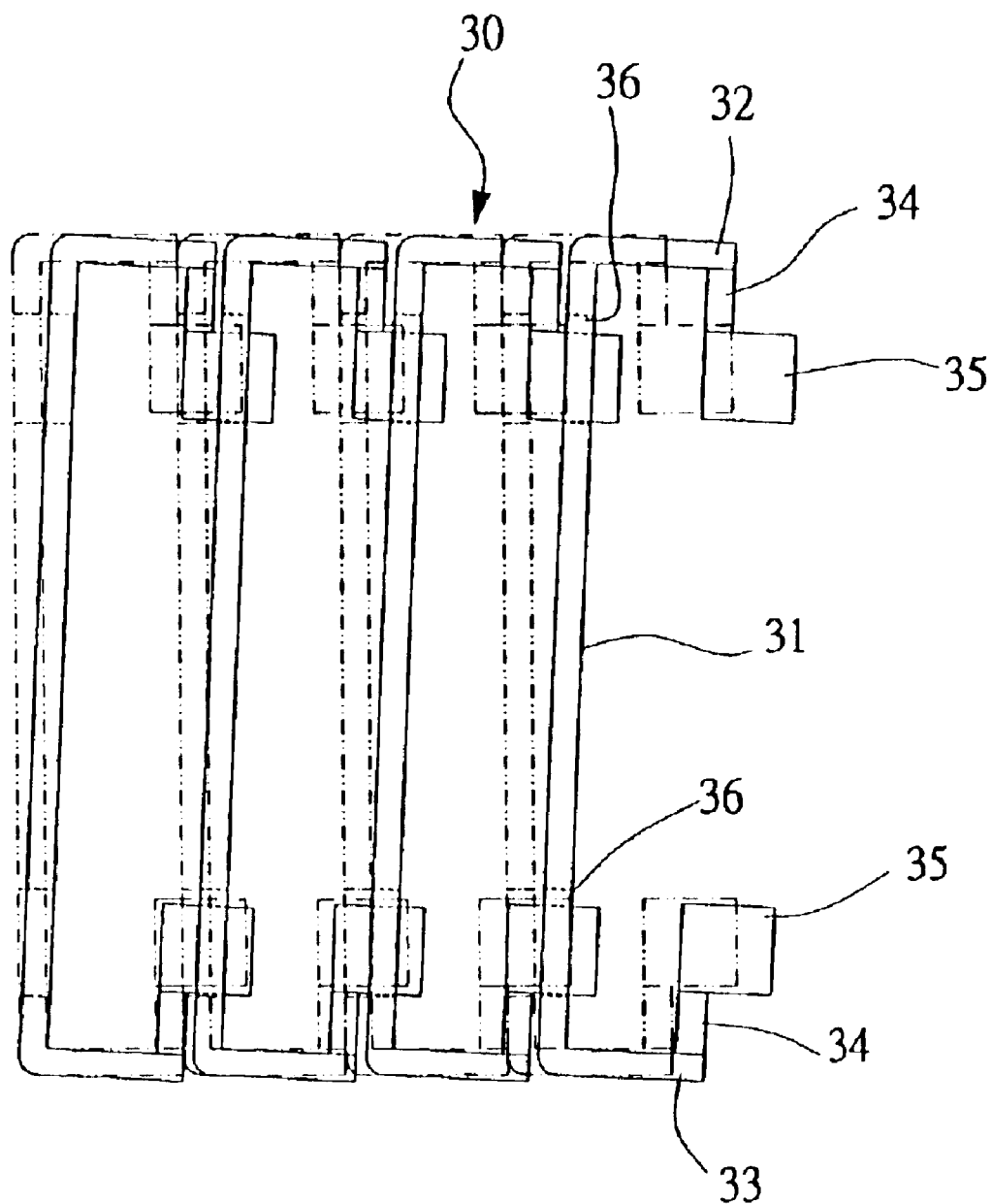
FIG. 6 is a side planar view showing the deficiency of the conventional fin pieces heat dissipating device in assembly.

Referring to FIGS. 2, 3 and 4, a plurality of protruding locking elements (20) are all bent at 90 degrees from the center portion fin pieces(11) while the folding parts (21a and 21b) of claws (20A and 20B) are again bent at 90 degrees toward the center portion fin piece (11). When two adjacent aluminum (or steel) fin pieces (10 and 10') are assembled, the folding parts (21a' and 21b') from the back of the fin piece (10') penetrate through the corresponding perforations (24a and 24b) of the front of the fin piece (10), the narrowed ends (25a' and 25b') of the folding parts (21a' and 21b') are then folded back flat into a interlocking position so as to complete a simple and secure hook-up. The present invention features the following advantages:

1. The locking elements are part of extensions from the four corners of the center portion fin piece(11) which can be processed in an economical sheet metal stamping and pressing procedure while the dense fin pieces installation with perforations on the fin pieces provides optimum heat dissipating effectiveness.
2. The claw are inserted downward or upward into the corresponding perforations then bent sideways for hook-up, it is a better connection that has high lateral shear resistance. The assembly is structurally sound and unlikely to become loose or detach under most circumstances.

It is of course to be understood that the embodiment described herein is merely illustrative of the principles of the invention and that a wide variety of the modifications thereto may be effected by persons skilled in the art without departing from the spirit and scope of the invention as set forth in the following claims.

What is claimed is:

1. A heat dissipating fin interlocking mechanism for: a plurality of fin pieces, each of the plurality of fin pieces comprising:
    a) a center portion fin piece;
    b) a base plate connected to the center portion fin piece;
    c) a plurality of venting openings located through the center portion fin piece; and
    d) a plurality of folded locking elements located on the center portion fin piece, each of the plurality of folded locking elements having at least one claw, each of the at least one claw having:
        i) a protruding section extending from the center portion fin piece;
        ii) a locking perforation formed in the protruding section;
        iii) a neck protruding from the protruding section;
        iv) a folding part extending from the neck; and
        v) a narrowed end extending from the folding part,
        wherein two adjacent fin pieces are connected by inserting the narrowed end of the at least one claw of one of the plurality of folded locking elements of a first fin piece through the locking perforation of the at least one claw of each of the plurality of folded locking elements of a second fin piece.

2. The heat dissipating fin interlocking mechanism according to claims 1, wherein the at least one claw includes two claws.

3. The heat dissipating fin interlocking mechanism according to claim 1, wherein the protruding section of each of the at least one claw is perpendicular to the center portion fin piece.

4. The heat dissipating fin interlocking mechanism according to claim 1, wherein the narrowed end of each of the at least one claw is parallel with the center portion fin piece.

5. The heat dissipating fin interlocking mechanism according to claim 1, wherein the narrowed end of each of the at least one claw is bent against the protruding section to lock two adjacent fin pieces together.

* * * * *